(12) United States Patent
Park et al.

(10) Patent No.: US 12,301,044 B2
(45) Date of Patent: May 13, 2025

(54) DOC SETTING APPARATUS AND METHOD

(71) Applicant: LG ENERGY SOLUTION, LTD., Seoul (KR)

(72) Inventors: Sang-Hyun Park, Daejeon (KR); Jun-Young Kwon, Daejeon (KR); Seol Yoo, Daejeon (KR); Min-Soo Park, Daejeon (KR); Jin-Uk Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 551 days.

(21) Appl. No.: 17/771,395

(22) PCT Filed: May 11, 2021

(86) PCT No.: PCT/KR2021/005914
§ 371 (c)(1),
(2) Date: Apr. 22, 2022

(87) PCT Pub. No.: WO2021/230639
PCT Pub. Date: Nov. 18, 2021

(65) Prior Publication Data
US 2022/0399739 A1 Dec. 15, 2022

(30) Foreign Application Priority Data
May 15, 2020 (KR) .......... 10-2020-0058601

(51) Int. Cl.
*H02J 7/00* (2006.01)
*G01R 31/3835* (2019.01)
(Continued)

(52) U.S. Cl.
CPC .... *H02J 7/007182* (2020.01); *G01R 31/3835* (2019.01); *H01M 10/44* (2013.01);
(Continued)

(58) Field of Classification Search
CPC ............ H02J 7/007182; H02J 7/00032; G01R 31/3835; H01M 10/44; H01M 10/48; H01M 4/587; H01M 2004/027
(Continued)

(56) References Cited

U.S. PATENT DOCUMENTS

| | | | |
|---|---|---|---|
| 2012/0226455 A1* | 9/2012 | Kumashiro | H01M 10/48 |
| | | | 702/63 |
| 2012/0226485 A1 | 9/2012 | Kumashiro et al. | |

(Continued)

FOREIGN PATENT DOCUMENTS

| | | |
|---|---|---|
| CN | 105870523 A | 8/2016 |
| CN | 110208700 A | 9/2019 |

(Continued)

OTHER PUBLICATIONS

International Search Report for PCT/KR2021/005914 (PCT/ISA/210) mailed on Aug. 17, 2021.
(Continued)

*Primary Examiner* — Nathaniel R Pelton
(74) *Attorney, Agent, or Firm* — Birch, Stewart, Kolasch & Birch, LLP

(57) ABSTRACT

A Depth of Charge (DOC) setting apparatus includes a charging and discharging unit for completely charging a battery to a set target voltage and discharging the completely-charged battery; a profile obtaining unit for obtaining a voltage profile for capacity and voltage of the battery while the battery is charged and discharged and obtaining a differential profile for capacity and differential voltage of the battery from the obtained voltage profile; and a processor for sequentially selecting any one of a plurality of preset voltages and setting the selected preset voltage as the target voltage and for obtaining a feature value for a target peak in each of a plurality of differential profiles and setting a DOC (Continued)

for the battery based on the plurality of obtained feature values.

20 Claims, 5 Drawing Sheets

(51) Int. Cl.
*H01M 10/44* (2006.01)
*H01M 10/48* (2006.01)
H01M 4/02 (2006.01)
H01M 4/587 (2010.01)

(52) U.S. Cl.
CPC ......... *H01M 10/48* (2013.01); *H02J 7/00032* (2020.01); *H01M 2004/027* (2013.01); *H01M 4/587* (2013.01)

(58) Field of Classification Search
USPC ....................................................... 320/128
See application file for complete search history.

(56) References Cited

U.S. PATENT DOCUMENTS

| | | |
|---|---|---|
| 2013/0314050 A1 | 11/2013 | Matsubara et al. |
| 2015/0226809 A1* | 8/2015 | Joe ........................ H01M 4/364 324/426 |
| 2016/0233691 A1 | 8/2016 | Sumi et al. |
| 2016/0254687 A1 | 9/2016 | Tanaka et al. |
| 2017/0030975 A1 | 2/2017 | Ueno et al. |
| 2017/0212170 A1 | 7/2017 | Torai et al. |
| 2018/0123186 A1 | 5/2018 | Kim et al. |
| 2018/0321326 A1 | 11/2018 | Tanaka et al. |
| 2020/0212511 A1 | 7/2020 | Adachi et al. |
| 2020/0366115 A1 | 11/2020 | Kim et al. |
| 2021/0041506 A1 | 2/2021 | Bae et al. |

FOREIGN PATENT DOCUMENTS

| | | |
|---|---|---|
| JP | 2013-247003 A | 12/2013 |
| JP | 5995050 B2 | 9/2016 |
| JP | 2017-129493 A | 7/2017 |
| JP | 6256761 B2 | 1/2018 |
| JP | 2019-50151 A | 3/2019 |
| KR | 10-2017-0045730 A | 4/2017 |
| KR | 10-2018-0113819 A | 10/2018 |
| KR | 10-2007503 B1 | 8/2019 |
| KR | 10-2020-0026128 A | 3/2020 |
| WO | WO 2013/157132 A1 | 10/2013 |
| WO | WO 2016/208745 A1 | 12/2016 |
| WO | WO 2019/199064 A1 | 10/2019 |
| WO | WO 2020/033343 A1 | 2/2020 |
| WO | WO 2020/046019 A1 | 3/2020 |

OTHER PUBLICATIONS

Extended European Search Report for European Application No. 21803568.1, dated May 17, 2023.
Wilhelm et al. "In Situ Neutron Diffraction Study of Lithiation Gradients in Graphite Anodes During Discharge and Relaxation", Journal of The Electrochemical Society, vol. 165, No. 9, 2018, pp. A1846-A1856.
Prof. Zhu Chunbo et al., New Spaceborne Battery Charge Regulator Development, Oct. 2018, whole document, Harbin Institute of Technology, 78 pages.
Robert R. Richardson et al., Battery Capacity Estimation From Partial-Charging Data Using Gaussian Process Regression, Oct. 11-13, 2017, whole document, Tysons, Virginia, USA, Proceedings of the ASME 2017 Dynamic Systems and Control Conference, 9 pages.

* cited by examiner

DOC SETTING APPARATUS AND METHOD

TECHNICAL FIELD

The present application claims priority to Korean Patent Application No. 10-2020-0058601 filed on May 15, 2020 in the Republic of Korea, the disclosures of which are incorporated herein by reference.

The present disclosure relates to a DOC setting apparatus and method, and more particularly, to a DOC setting apparatus and method capable of setting a DOC (Depth of Charge) of a battery.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel-hydrogen batteries, nickel-zinc batteries, lithium batteries and the like. Among them, the lithium batteries are in the limelight since they have almost no memory effect compared to nickel-based batteries and also have very low self-discharging rate and high energy density.

However, the battery has a problem in that the yield is lowered due to inverse voltage failure during the production process. It has been pointed out that one of the causes of such inverse voltage of the battery is non-uniformity of $LiC_6$ and $LiC_{12}$ in a negative electrode of the battery (Non-patent Literature 1). Therefore, in order to prevent inverse voltage of the battery, there is a need to solve the non-uniformity between $LiC_6$ and $LiC_{12}$ in the negative electrode of the battery.

(Non-patent Literature 1) J Wilhelm et al., In Situ Neutron Diffraction Study of Lithiation Gradients in Graphite Anodes during Discharge and Relaxation, *Journal of The Electrochemical Society*, 165 (9) A1846-A1856 2018.

DISCLOSURE

Technical Problem

The present disclosure is designed to solve the problems of the related art, and therefore the present disclosure is directed to providing a DOC setting apparatus and method for setting a DOC (Depth of Charge) of a battery based on a target peak in which the behavior of $LiC_{12}$ is most prominent.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a depth of charge (DOC) setting apparatus, comprising: a charging and discharging unit configured to charge a battery to a set target voltage and discharge the completely-charged battery; a profile obtaining unit configured to obtain a voltage profile for capacity and voltage of the battery while the battery is charged and discharged and obtain a differential profile for capacity and differential voltage of the battery from the obtained voltage profile; and a processor electrically connected to the charging and discharging unit and configured to sequentially select any one of a plurality of preset voltages and set the selected preset voltage as the target voltage, wherein when the profile obtaining unit obtains all of a plurality of differential profiles corresponding to the plurality of voltages, the processor is configured to obtain a feature value for a target peak in each of the plurality of differential profiles and set a DOC for the battery based on the plurality of obtained feature values.

The processor may be configured to compare magnitudes of the plurality of obtained feature values, select any one of a plurality of target voltages respectively corresponding to the plurality of obtained feature values as a reference voltage according to the comparison result, and set the selected reference voltage as the DOC.

The processor may be configured to calculate a magnitude difference value between a plurality of feature values whose corresponding target voltages are close to each other among the plurality of obtained feature values, select a plurality of reference feature values for which the calculated magnitude difference value is greatest, and select any one of the plurality of target voltages as the reference voltage according to the magnitude difference value of the plurality of selected reference feature values.

The processor may be configured to calculate the magnitude difference value by comparing magnitudes of two feature values close to each other based on the corresponding target voltages thereof.

The processor may be configured to select a target voltage at a lowest potential side among the plurality of target voltages corresponding to the plurality of selected reference feature values as the reference voltage.

The processor may be configured to select the target voltage at the low potential side as the reference voltage, when the magnitude difference value between the plurality of selected reference feature values is greater than or equal to a predetermined magnitude value.

The processor may be configured to select a target voltage at a highest high potential side among the plurality of target voltages as the reference voltage, when the magnitude difference value between the plurality of selected reference feature values is smaller than a predetermined magnitude value.

The profile obtaining unit may be configured to obtain a differential profile for the differential voltage, which is obtained by differentiating the voltage of the battery by the capacity, and the capacity of the battery.

The processor may be configured to determine a plurality of peak pairs in each of the plurality of differential profiles, select a peak pair where differential voltages of a plurality of peaks included in the determined peak pairs are most different among the determined peak pairs, and select a peak at a low capacity side among the plurality of peaks included in the selected peak pair as the target peak.

The processor may be configured to determine two peaks located at a top and a bottom in a region where the differential voltage increases as the capacity of the battery increases among the plurality of peaks as one peak pair.

The battery includes lithium and graphite as a negative electrode active material, and the target peak may be a peak associated with behavior of $LiC_{12}$ according to the DOC.

The processor may be configured to obtain a plurality of normal distribution profiles by normalizing each of the plurality of differential profiles and obtain a full width at half maximum (FWHM) for a target peak corresponding to each of the plurality of obtained normal distribution profiles as the feature value.

A battery manufacturing device according to another aspect of the present disclosure may comprise the DOC setting apparatus according to an aspect of the present disclosure.

A DOC setting method according to still another aspect of the present disclosure may comprise: a target voltage setting step of sequentially selecting any one of a plurality of preset voltages and setting the selected preset voltage as a target voltage; a charging and discharging step of charging a battery to the target voltage and discharging the completely-charged battery; a voltage profile obtaining step of obtaining a voltage profile for capacity and voltage of the battery while the battery is charged and discharged; a differential profile obtaining step of obtaining a differential profile for capacity and differential voltage of the battery from the obtained voltage profile; a differential profile repeatedly obtaining step of obtaining all of a plurality of differential profiles corresponding to the plurality of voltages; a feature value obtaining step of obtaining a feature value for a target peak in each of the plurality of differential profiles; and a DOC setting step of setting a DOC for the battery based on the plurality of obtained feature values.

Advantageous Effects

According to one aspect of the present disclosure, it is possible to effectively prevent inverse voltage of the battery from being generated.

In addition, according to one aspect of the present disclosure, there is an advantage that the DOC capable of maximizing the performance of the battery may be set while suppressing the generation of inverse voltage of the battery.

The effects of the present disclosure are not limited to the above, and other effects not mentioned herein will be clearly understood by those skilled in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "processor" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
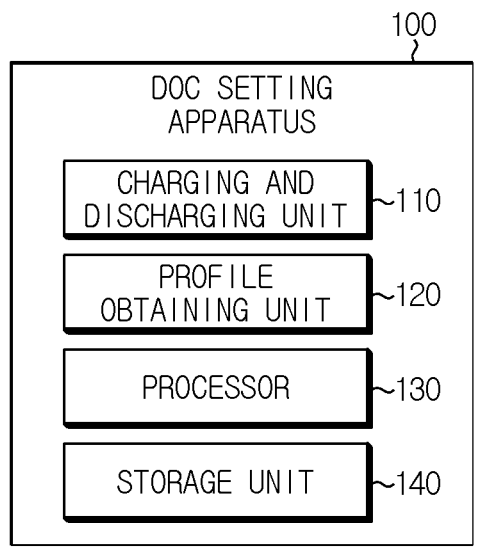
FIG. 1 is a diagram schematically showing a DOC setting apparatus according to an embodiment of the present disclosure.
Figure 2:
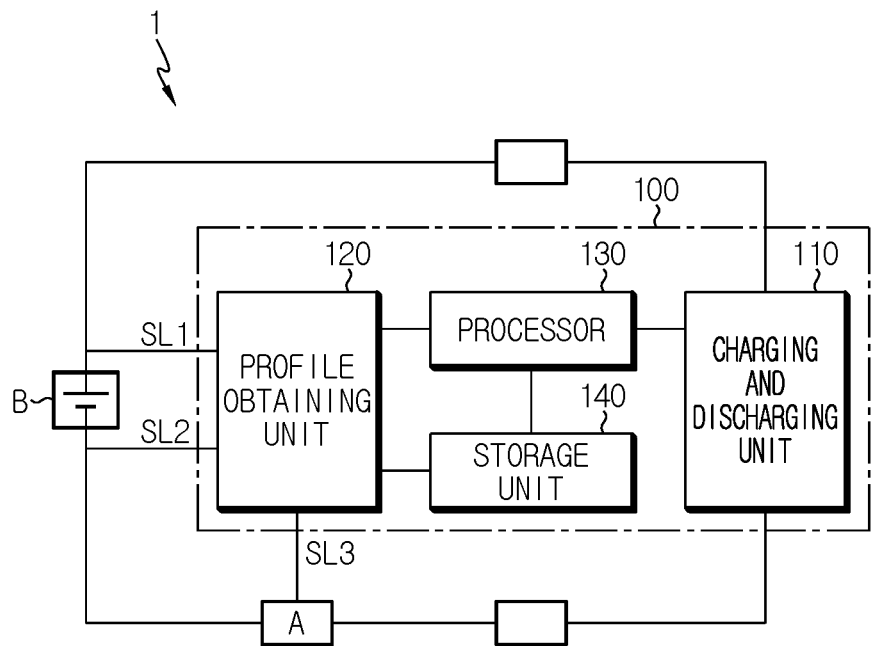
FIG. 2 is a diagram schematically showing an exemplary configuration of a battery manufacturing device including the DOC setting apparatus according to an embodiment of the present disclosure.

FIG. 1 is a diagram schematically showing a DOC setting apparatus 100 according to an embodiment of the present disclosure. FIG. 2 is a diagram schematically showing an exemplary configuration of a battery manufacturing device 1 including the DOC setting apparatus 100 according to an embodiment of the present disclosure.

Specifically, the battery manufacturing device 1 may be applied in the process of manufacturing a battery B. Preferably, the battery manufacturing device 1 may be applied during an activation process among various processes in which the battery B is manufactured.

Referring to FIG. 1, the DOC setting apparatus 100 may include a charging and discharging unit 110, a profile obtaining unit 120, and a processor 130.

Here, the battery B may refer to one independent battery cell that includes a negative electrode terminal and a positive electrode terminal and is physically separable. For example, one pouch-type lithium polymer cell may be regarded as the battery B.

The charging and discharging unit 110 may be configured to charge the battery B to a set target voltage.

Here, the target voltage at which the charging of the battery B is completed may be set by the processor 130. In addition, the charging and discharging unit 110 may obtain information about the target voltage from the processor 130 and charge the battery B to the target voltage.

For example, in the embodiment of FIG. 2, the charging and discharging unit 110 may be electrically connected to the battery B. In addition, the charging and discharging unit 110 may charge the battery B until the voltage of the battery B reaches the target voltage.

In addition, the charging and discharging unit 110 may be configured to discharge the battery B that is completely charged.

Here, the completion of charging means that the voltage of the battery B reaches the target voltage. That is, the charging and discharging unit 110 may charge the battery B to the target voltage and then discharge the battery B again. For example, before the produced battery B is shipped, an activation process for the battery B may be performed while charging and discharging by the charging and discharging unit 110.

Preferably, the charging and discharging unit 110 may discharge the battery B at a low rate. For example, the charging and discharging unit 110 may discharge the battery B at a C-rate of 0.33 C or less. More preferably, the charging and discharging unit 110 may discharge the battery B at a C-rate of 0.05 C. Specifically, in the process of discharging the battery B by the charging and discharging unit 110, the profile obtaining unit 120 may obtain a differential profile 20, and the differential profile 20 may include a plurality of peaks indicating the voltage behavior of the battery B. Since the peak is more accurately displayed without being crushed or omitted when it is discharged at a low rate, the charging and discharging unit 110 may discharge the battery B at a low rate.

The profile obtaining unit 120 may be configured to obtain a voltage profile for capacity and voltage of the battery B while the battery B is charged or discharged.

Specifically, the profile obtaining unit 120 may measure the voltage at both ends of the battery B and the current of the battery B. For example, in the embodiment of FIG. 2, the profile obtaining unit 120 may measure the voltage of the battery B through a first sensing line SL1 and a second sensing line SL2. In addition, the profile obtaining unit 120 may be connected to a current measuring unit A provided on a high current path of the battery B through a third sensing line SL3. Therefore, the profile obtaining unit 120 may measure the current of the battery B through the third sensing line SL3.

For example, the voltage profile may be a profile indicating the voltage of the battery B with respect to the capacity of the battery B. More specifically, the voltage profile may be expressed as a two-dimensional graph in which the X-axis is the capacity of the battery B and the Y-axis is the voltage of the battery B.

The profile obtaining unit 120 may obtain the voltage profile while the battery B is being charged and/or discharged, but hereinafter, for convenience of explanation, it is assumed that the voltage profile is obtained while the battery B is being discharged.

The profile obtaining unit 120 may be configured to obtain a differential profile 20 for capacity and differential voltage of the battery B from the obtained voltage profile. Specifically, the profile obtaining unit 120 may be configured to obtain a differential profile 20 for the differential voltage, which is obtained by differentiating the voltage of the battery B by the capacity, and the capacity of the battery B.

For example, the differential profile 20 may be a profile indicating the differential voltage of the battery B with respect to the capacity of the battery B. Here, the differential voltage may be a value (dV/dQ) obtained by differentiating the voltage of the battery B by the capacity of the battery B. More specifically, the differential profile 20 may be expressed as a two-dimensional graph in which the X-axis is the capacity of the battery B and the Y-axis is the differential voltage of the battery B.

Figure 3:
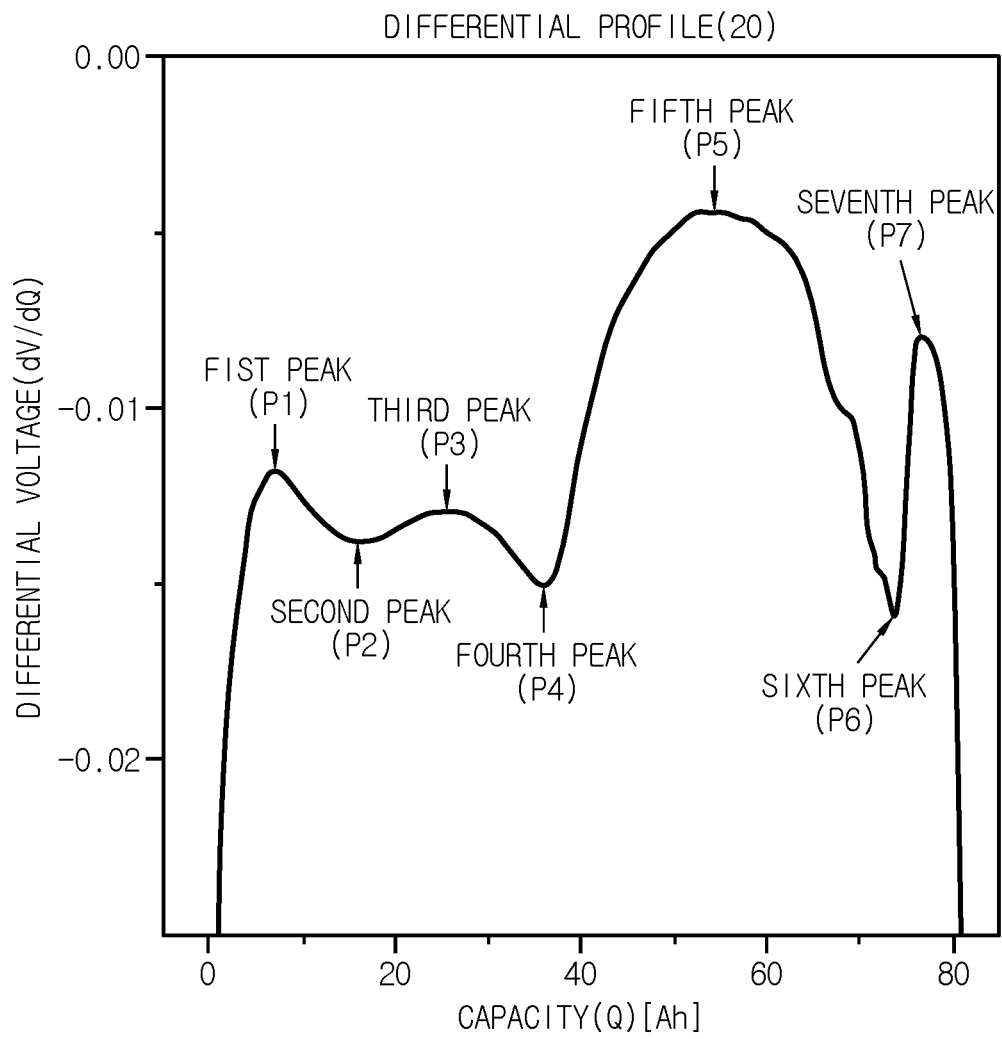
FIG. 3 is a diagram schematically showing an embodiment of a differential profile obtained by the DOC setting apparatus according to an embodiment of the present disclosure.

FIG. 3 is a diagram schematically showing an embodiment of a differential profile 20 obtained by the DOC setting apparatus 100 according to an embodiment of the present disclosure.

Specifically, FIG. 3 shows the differential profile 20 obtained by the profile obtaining unit 120 while the battery B charged to 4.3 [V] is being discharged to 2.0 [V]. The target voltage of the battery B corresponding to the corresponding differential profile 20 is 4.3 [V].

In the embodiment of FIG. 3, the differential profile 20 includes a plurality of peaks, and in order to clearly show the plurality of peaks, the battery B is discharged at a C-rate of 0.05 C. Here, the peak is a point corresponding to an inflection point in the voltage profile, and may mean a point where an instantaneous slope is 0 in the differential profile 20. For example, the differential profile 20 of the embodiment of FIG. 3 may include a first peak P1, a second peak P2, a third peak P3, a fourth peak P4, a fifth peak P5, a sixth peak P6, and a seventh peak P7.

The processor 130 may be electrically connected to the charging and discharging unit 110 and may be configured to sequentially select any one of a plurality of preset voltages and set the selected preset voltage as the target voltage.

Specifically, the plurality of preset voltages may be set according to a maximum usable voltage of the battery B. For example, for the battery B, the plurality of preset voltages may be a first target voltage of 4.0 [V], a second target voltage of 4.1 [V], a third target voltage of 4.2 [V], and a fourth target voltage of 4.3 [V]. Hereinafter, it will be described that the plurality of voltages are set as four voltages according to a voltage interval of 0.1 [V], but it should be understood that the voltage interval between the plurality of voltages becomes narrower and the number of the plurality of set voltages may be increased in order to more accurately set a DOC (Depth of Charge) of the battery B.

For example, in the embodiment of FIG. 3, the processor 130 may set the target voltage to 4.3 [V], and transmit the set target voltage (4.3 [V]) to the charging and discharging unit 110. After that, the charging and discharging unit 110 may charge the battery B until the voltage of the battery B reaches 4.3 [V], and then discharge the battery B until the voltage of the battery B reaches 2.0 [V]. In the process of discharging the battery B, the profile obtaining unit 120 may measure the voltage and current of the battery B, and may obtain the differential profile 20 based on the measured voltage and current.

In addition, if the profile obtaining unit 120 obtains all of the plurality of differential profiles corresponding to the plurality of voltage, the processor 130 may be configured to obtain a feature value for a target peak in each of the plurality of differential profiles.

In the embodiment of FIG. 2, the processor 130 may be electrically connected to the profile obtaining unit 120. That is, the processor 130 may determine whether the profile obtaining unit 120 obtains the differential profile 20 corresponding to any one target voltage. In addition, when the profile obtaining unit 120 obtains the differential profile 20 corresponding to any one target voltage, the processor 130 may set a voltage that does not overlap with the corresponding target voltage among the plurality of preset voltages as the target voltage.

Figure 4:
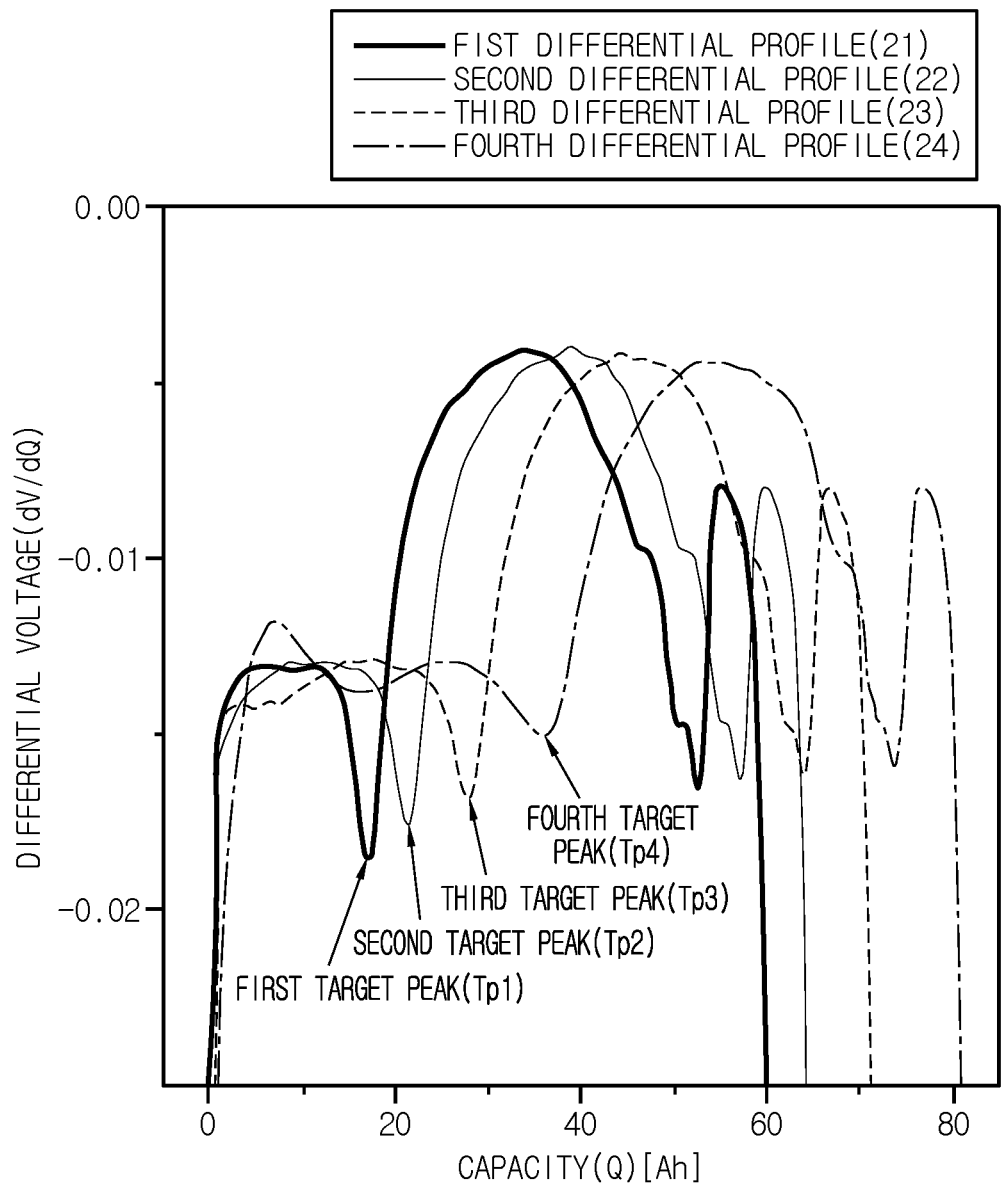
FIG. 4 is a diagram schematically showing an embodiment of a plurality of differential profiles obtained by the DOC setting apparatus according to an embodiment of the present disclosure.

FIG. 4 is a diagram schematically showing an embodiment of a plurality of differential profiles 21, 22, 23, 24 obtained by the DOC setting apparatus 100 according to an embodiment of the present disclosure.

In the embodiment of FIG. 4, it is assumed that the plurality of voltages are preset as a first target voltage of 4.0 [V], a second target voltage of 4.1 [V], a third target voltage of 4.2 [V], and a fourth target voltage of 4.3 [V].

First, the processor 130 may set 4.0 [V] as a first target voltage among the plurality of voltages, and transmit the set first target voltage to the charging and discharging unit 110. In addition, the profile obtaining unit 120 may obtain the first differential profile 21 while the battery B charged to the first target voltage is being discharged.

Next, the processor 130 may set 4.1 [V] as a second target voltage among the plurality of voltages, and transmit the set second target voltage to the charging and discharging unit 110. In addition, the profile obtaining unit 120 may obtain the second differential profile 22 while the battery B charged to the second target voltage is being discharged.

Next, the processor 130 may set 4.2 [V] as a third target voltage among the plurality of voltages, and transmit the set third target voltage to the charging and discharging unit 110. In addition, the profile obtaining unit 120 may obtain the third differential profile 23 while the battery B charged to the third target voltage is being discharged.

Finally, the processor 130 may set 4.3 [V] as a fourth target voltage among the plurality of voltages, and transmit the set fourth target voltage to the charging and discharging unit 110. In addition, the profile obtaining unit 120 may obtain the fourth differential profile 24 while the battery B charged to the fourth target voltage is being discharged.

After that, the processor 130 may select target peaks Tp1, Tp2, Tp3, Tp4 in each of the first to fourth differential profile 21 to 24, and calculate a feature value of the selected target peak.

Here, the target peak may be any one peak selected from the plurality of peaks included in the differential profile. Specifically, the target peak may be a peak associated with the behavior of $LiC_{12}$ according to DOC, in a battery B in which graphite is included as a negative electrode active material.

For example, in the embodiment of FIG. 3, among the plurality of peaks P1 to P7, the fourth peak P4 may be selected as a target peak. The process in which the processor 130 selects the target peak will be described later in detail.

Also, in the embodiment of FIG. 4, the processor 130 may select the first target peak Tp1 in the first differential profile 21 and may select the second target peak Tp2 in the second differential profile 22. In addition, the processor 130 may select the third target peak Tp3 in the third differential profile 23 and may select the fourth target peak Tp4 in the fourth differential profile 24.

In addition, the feature value of the target peak may be a value selected to obtain a difference between the target peaks Tp1, Tp2, Tp3, Tp4 selected in each of the plurality of differential profiles 21, 22, 23, 24. For example, the feature value of the target peak may include a capacity value, a differential voltage value, or a full width at half maximum (FWHM) of the target peak. Preferably, the feature value of the target peak may be FWHM. Here, the FWHM may also be translated into various terms.

Figure 5:
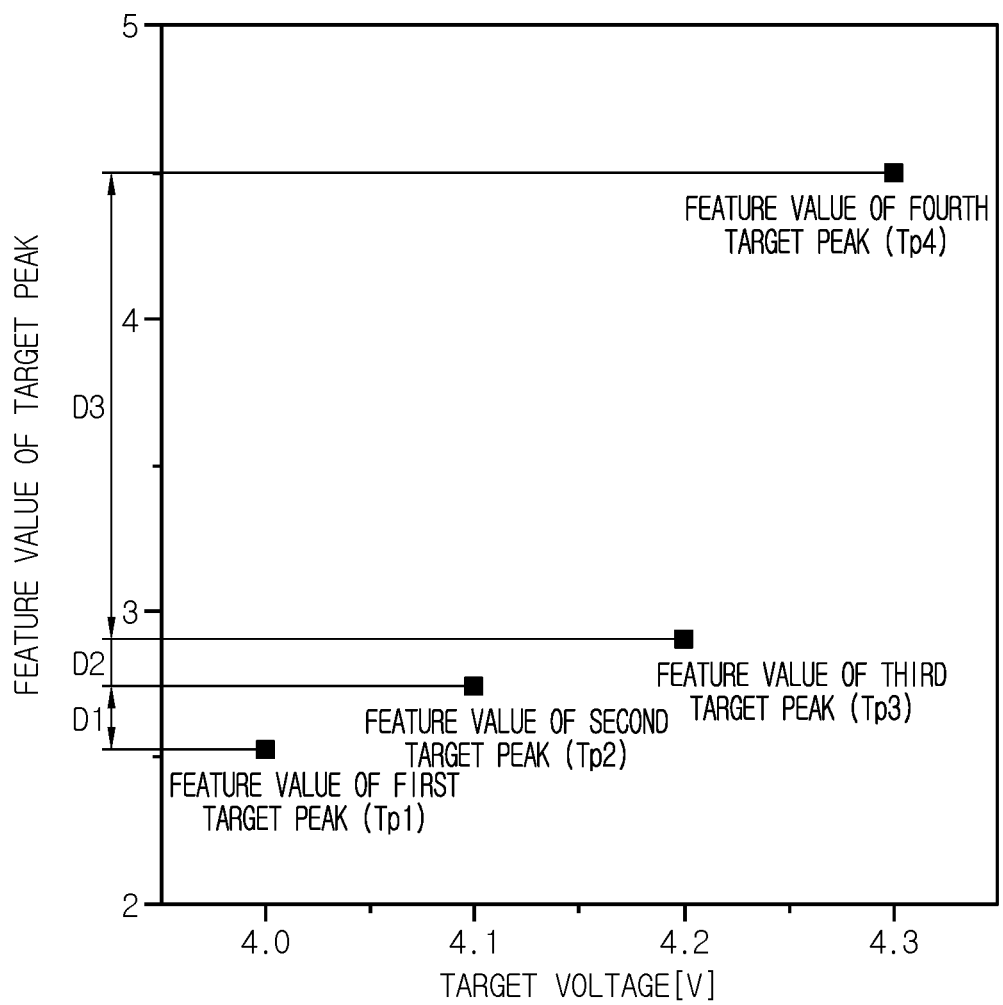
FIG. 5 is a diagram schematically showing an embodiment of feature points of a plurality of target peaks obtained by the DOC setting apparatus according to an embodiment of the present disclosure.

FIG. 5 is a diagram schematically showing an embodiment of feature points of a plurality of target peaks Tp1, Tp2, Tp3, Tp4 obtained by the DOC setting apparatus 100 according to an embodiment of the present disclosure.

Referring to FIG. 5, the processor 130 may calculate a feature value of each of the first target peak Tp1, the second target peak Tp2, the third target peak Tp3 and the fourth target peak Tp4. Specifically, the feature value calculated in the embodiment of FIG. 5 may be a FWHM for the target peak.

In addition, the processor 130 may be configured to set the DOC for the battery B based on the plurality of obtained feature values.

Here, DOC is a value set in the activation process of the battery B, and may mean a maximum allowable charging voltage for the battery B, which is set to prevent an inverse voltage from being generated in the battery B.

For example, even though batteries B are manufactured in the same production line, inverse voltage may be generated in some batteries B due to various causes. Since the battery B, which generates inverse voltage, has a problem in that the voltage increases over time, it is important to set the DOC to be low from the processing stage (especially, the activation process), unlike a battery B where inverse voltage does not occur. In addition, since it is necessary to experimentally check whether the inverse voltage is generated in the battery B, the processor 130 may determine whether the inverse voltage is likely to be generated in a battery B based on the feature values of the plurality of target peaks for the battery B, and set the DOC of the battery B appropriately according to the determination result.

For example, in the embodiment of FIG. 5, the processor 130 may compare the feature value of the first target peak Tp1, the feature value of the second target peak Tp2, the feature value of the third target peak Tp3, and the feature value of the fourth target peak Tp4, and set 4.2 [V] that is a target voltage corresponding to the third differential profile 23 as the DOC for the battery B based on the comparison result.

Therefore, the DOC setting apparatus 100 according to an embodiment of the present disclosure may prevent inverse voltage from being generated in the battery B in advance by setting the DOC corresponding to the battery B from the activation process. Therefore, since the degradation rate of the battery B is slowed so that the battery B may be used for a longer period of time, economical efficiency and eco-friendliness may be secured. In addition, since an appropriate DOC is set for each battery B, an accident that may occur due to an inverse voltage of the battery B may be prevented in advance.

Meanwhile, the processor 130 included in the DOC setting apparatus 100 according to an embodiment of the present disclosure may optionally include a processor 130, an application-specific integrated circuit (ASIC), another chipset, a logic circuit, a register, a communication modem, and a data processing device, and the like, known in the art to execute various control logics disclosed below. In addition, when the control logic is implemented in software, the processor 130 may be implemented as a set of program modules. At this time, the program module may be stored in a memory and executed by the processor 130. The memory may be provided in or out of the processor 130, and may be connected to the processor 130 by various well-known means.

In addition, the DOC setting apparatus 100 may further comprise a storage unit 140. The storage unit 140 may store programs, data and the like required for the processor 130 to set the DOC of the battery B. That is, the storage unit 140 may store data necessary for operation and function of each component of the DOC setting apparatus 100, data generated in the process of performing the operation or function, or the like. The storage unit 140 is not particularly limited in its kind as long as it is a known information storage means that can record, erase, update and read data. As an example, the information storage means may include RAM, flash memory, ROM, EEPROM, registers, and the like. In addition, the storage unit 140 may store program codes in which processes executable by the processor 130 are defined.

For example, the plurality of voltage profiles and the plurality of differential profiles 21, 22, 23, 24 obtained by the profile obtaining unit 120 may be stored in the storage unit 140. In addition, the processor 130 may obtain the differential profiles 21, 22, 23, 24 directly from the profile obtaining unit 120, or obtain the stored differential profiles 21, 22, 23, 24 by accessing the storage unit 140.

Also, the DOC of the battery B set by the processor 130 may be stored in the storage unit 140. For example, the DOC set by the processor 130 may be stored in the storage unit 140 for each battery B. After that, the DOC of the battery B stored in the storage unit 140 may be stored in a battery management system (BMS) configured to manage the battery B or a storage unit connected to the battery management system.

That is, the DOC setting apparatus 100 according to an embodiment of the present disclosure may set the DOC corresponding to an individual battery B and provide the set DOC to the battery management system configured to manage the individual battery B. Accordingly, when the battery B is shipped and used, it is possible to prevent an inverse voltage from being generated in the battery B according to the DOC set by the DOC setting apparatus 100. In addition, the battery B may be degraded slowly, so that the lifespan of the battery B may be increased.

Hereinafter, the process of selecting a target peak by the processor 130 will be described in more detail.

The processor 130 may be configured to compare magnitudes of the plurality of obtained feature values.

Specifically, the processor 130 may calculate a magnitude difference value between a plurality of feature values whose corresponding target voltages are close to each other. More specifically, the processor 130 may calculate the magnitude difference value by comparing the magnitudes of two feature values close to each other based on the corresponding target voltages thereof.

For example, in the embodiment of FIG. 5, the feature values whose corresponding target voltages are close to each other are the feature value of the first target peak Tp1 and the feature value of the second target peak Tp2, the feature value of the second target peak Tp2 and the feature value of the third target peak Tp3, and the feature value of the third target peak Tp3 and the feature value of the fourth target peak Tp4. The processor 130 may calculate a first magnitude difference value D1 between the feature value of the first target peak Tp1 and the feature value of the second target peak Tp2. In addition, the processor 130 may calculate a second magnitude difference value D2 between the feature value of the second target peak Tp2 and the feature value of the third target peak Tp3. In addition, the processor 130 may calculate a third magnitude difference value D3 between the feature value of the third target peak Tp3 and the feature value of the fourth target peak Tp4.

The processor 130 may be configured to select any one of the plurality of target voltages corresponding to each of the plurality of obtained feature values as a reference voltage according to the comparison result. In addition, the processor 130 may be configured to set the selected reference voltage as the DOC.

In an embodiment, the processor 130 may be configured to select a plurality of reference feature values for which the calculated magnitude difference values are greatest. In addition, the processor 130 may be configured to select any one of the plurality of target voltages as the reference voltage according to a magnitude difference value between the plurality of selected reference feature values.

For example, in the embodiment of FIG. 5, the processor 130 may compare the first magnitude difference value D1, the second magnitude difference value D2, and the third magnitude difference value D3. Because the third magnitude difference value D3 is greater than the first magnitude difference value D1 and the second magnitude difference value D2, the processor 130 may select the feature value of the third target peak Tp3 and the feature value of the fourth target peak Tp4 as the reference feature values. In addition, the processor 130 may select any one of the third target voltage corresponding to the third target peak Tp3 and the fourth target voltage corresponding to the fourth target peak Tp4 as the reference voltage.

Specifically, the processor 130 may be configured to select a target voltage at a lowest potential side as the reference voltage among the plurality of target voltages corresponding to the plurality of selected reference feature values.

For example, in the embodiment of FIG. 5, the processor 130 may select the third target voltage, which is at a lower potential side, as the reference voltage among the third target voltage and the fourth target voltage. That is, the processor 130 may select two reference feature values whose magnitude difference values are greatest, and set a lower target voltage among two target voltages respectively corresponding to the two selected reference feature values as the DOC of the battery B.

That is, since the DOC of the battery B is set to be low, it is possible to suppress the generation of inverse voltage of the battery B. In addition, since the DOC of the battery B is set based on two reference feature values having the greatest magnitude difference values between the feature values of the plurality of target peaks, it is possible to prevent the DOC of the battery B from being set to be too low. Therefore, the DOC setting apparatus 100 according to an embodiment of the present disclosure has an advantage of setting the DOC such that the performance of the battery B may be maximized while suppressing the occurrence of the inverse voltage of the battery B.

In another embodiment, the processor 130 may be configured to select the target voltage at a low potential side as the reference voltage, when the magnitude difference value between the plurality of selected reference feature values is equal to or greater than a predetermined magnitude value.

For example, the predetermined magnitude value may be set to a predetermined value. In the embodiment of FIG. 5, the predetermined magnitude value may be set to any one of 0.5 or more and less than 1.

As another example, the predetermined magnitude value may be set to a value twice as large as a second largest magnitude difference value among the plurality of magnitude difference values. In the embodiment of FIG. 5, the plurality of magnitude difference values are the first magnitude difference value D1, the second magnitude difference value D2, and the third magnitude difference value D3. In addition, among the plurality of magnitude difference values, the third magnitude difference value D3 is the largest, and the first magnitude difference value D1 is the second largest. Accordingly, the predetermined magnitude value may be set to a value twice as large as the first magnitude difference value D1.

The processor 130 may set the predetermined magnitude value in such a way to appropriately set the DOC of the battery B when the magnitude difference value between the plurality of reference feature values is significantly different from the magnitude difference value between the remaining feature values.

Unlike the above-described embodiment, the processor 130 may set the target voltage at a low potential side to as the DOC of the battery B among the plurality of target voltages corresponding to the plurality of reference feature values, only when the magnitude difference value between the plurality of reference feature values is equal to or greater than the predetermined magnitude value. Conversely, when the magnitude difference value between the plurality of selected reference feature values is smaller than the predetermined magnitude value, the processor 130 may be configured to select a target voltage at a highest potential side as the reference voltage among the plurality of target voltages.

For example, in the embodiment of FIG. 5, since the third magnitude difference value D3 is greater than the first magnitude difference value D1 and the second magnitude difference value D2, the feature value of the third target peak Tp3 and the feature value of the fourth target peak Tp4 may be selected as the plurality of reference feature value. In addition, the processor 130 may compare the third magnitude difference value D3 and the predetermined magnitude value with each other. If the third magnitude difference value D3 is greater than or equal to the predetermined magnitude value, the processor 130 may set the third target voltage, which is a target voltage at a low potential side among the third target voltage and the fourth target voltage corresponding to the plurality of reference feature values, as the DOC of the battery B.

That is, if the magnitude difference value between the plurality of reference feature values is equal to or greater than the predetermined magnitude value, when the DOC of the battery B is set as the target voltage at a high potential side among the plurality of target voltages corresponding to the plurality of reference feature values, the processor 130 may determine that an inverse voltage occurs in the battery B. Accordingly, in order to prevent an inverse voltage from being generated in the battery B, the processor 130 may set the DOC of the battery B as the target voltage at a low potential side among the plurality of target voltages corresponding to the plurality of reference feature values.

Conversely, in the embodiment of FIG. 5, if the third magnitude difference value D3 is less than the predetermined magnitude value, the processor 130 may set the fourth target voltage, which is a target voltage at highest potential side among the first target voltage, the second target voltage, the third target voltage and the fourth target voltage, as the DOC of the battery B.

That is, if the magnitude difference values between the feature values of the plurality of target peaks are all less than the predetermined magnitude value, the processor 130 may determine that the inverse voltage is not generated in the battery B. Accordingly, in order to maximize the performance of the battery B, the processor 130 may set the DOC of the battery B as the target voltage at a highest potential side among the plurality of target voltages.

Therefore, the DOC setting apparatus 100 according to an embodiment of the present disclosure has an advantage of achieving maximum performance of the battery B and harmoniously suppressing the inverse voltage of the battery B by setting the DOC of the battery B based on the result of comparing the magnitude difference value between the predetermined magnitude value and the reference feature value.

Hereinafter, the process in which the processor 130 selects a target peak in each of the plurality of differential profiles 21, 22, 23, 24 will be described in detail.

The processor 130 may be configured to determine at least one peak pair in each of the plurality of differential profiles 21, 22, 23, 24. For example, in the embodiment of FIG. 3, the processor 130 may select the first peak P1, the second peak P2, the third peak P3, the fourth peak P4, the fifth peak P5, the sixth peak P6, and the seventh peak P7.

Specifically, the processor 130 may be configured to determine two peaks, which are positioned at a top and a bottom pair in a region where the differential voltage increases as the capacity of the battery B increases, as one peak pair among the plurality of peaks.

For example, in the embodiment of FIG. 3, the second peak P2 and the third peak P3 may be included in a region where the differential voltage increases as the capacity increases. In addition, since the second peak P2 and the third peak P3 are respectively located at the bottom and the top of the region where the differential voltage increases, the second peak P2 and the third peak P3 may be determined as one peak pair.

In addition, the fourth peak P4 and the fifth peak P5 may also be included in the region where the differential voltage increases as the capacity increases. In addition, since the fourth peak P4 and the fifth peak P5 are respectively located at the bottom and the top of the section where the differential voltage increases, the fourth peak P4 and the fifth peak P5 may be determined as one peak pair.

In addition, the sixth peak P6 and the seventh peak P7 may also be included in the region where the differential voltage increases as the capacity increases. In addition, since the sixth peak P6 and the seventh peak P7 are respectively located at the bottom and the top of the region where the differential voltage increases, the sixth peak P6 and the seventh peak P7 may be determined as one peak pair.

That is, the processor 130 may determine a first peak pair including the second peak P2 and the third peak P3, a second peak pair including the fourth peak P4 and the fifth peak P5, and a third peak pair including the sixth peak P6 and the seventh peak P7.

The processor 130 may be configured to select a peak pair in which the differential voltages of the plurality of peaks included therein are most different, among the determined peak pairs.

For example, in the embodiment of FIG. 3, the processor 130 may calculate a difference between the differential voltages of the second peak P2 and the third peak P3 included in the first peak pair. Also, the processor 130 may calculate a difference between the differential voltages of the fourth peak P4 and the fifth peak P5 included in the second peak pair. Also, the processor 130 may calculate a difference between the differential voltages of the sixth peak P6 and the seventh peak P7 included in the third peak pair. In addition, the processor 130 may select the second peak pair as a peak pair in which the differential voltages of the plurality of peaks included therein are most different, among the first peak pair, the second peak pair and the third peak pair.

In addition, the processor 130 may be configured to select a peak at a low capacity side among the plurality of peaks included in the selected peak pair as the target peak.

For example, in the embodiment of FIG. 3, the processor 130 may select the fourth peak P4 as the target peak among the fourth peak P4 and the fifth peak P5 included in the second peak pair. Specifically, in the battery B in which graphite is included as a negative electrode active material, the peak may be a peak associated with the behavior of $LiC_{12}$ according to DOC.

Referring back to Non-patent Literature 1, one of the causes of inverse voltage of the battery B may be non-uniformity between $LiC_6$ and $LiC_{12}$.

In order to prevent such non-uniformity from occurring, the processor 130 may select a target peak showing the best behavior of $LiC_{12}$ in each differential profile 20 in the above-described manner, and compare the feature values of the plurality of target peaks to set the DOC of the battery B. That is, $LiC_6$ and $LiC_{12}$ may be uniformly maintained in the battery B whose DOC is set by the processor 130.

Specifically, the phase change between $LiC_6$ and $LiC_{12}$ may proceed abruptly in a predetermined voltage section, and if non-uniformity is caused between $LiC_6$ and $LiC_{12}$, an inverse voltage may be generated in the battery B. For example, in the embodiment of FIG. 5, the predetermined voltage section may be a section of 4.2 [V] to 4.3 [V].

Therefore, the DOC setting apparatus 100 according to an embodiment of the present disclosure may prevent a rapid phase change of $LiC_6$ and $LiC_{12}$ from occurring by comparing the feature values of the plurality of target peaks for the battery B and setting an appropriate DOC for the battery B. Through this, it is possible to effectively prevent an inverse voltage from being generated in the battery B.

The processor 130 may be configured to obtain a plurality of normal distribution profiles by normalizing each of the plurality of differential profiles 21, 22, 23, 24.

For example, in the embodiment of FIG. 4, each differential profile 20 may not follow a normal distribution. Accordingly, the processor 130 may normalize each of the plurality of differential profiles 21, 22, 23, 24 to calculate the FWHM for the target peak of each of the plurality of differential profiles 21, 22, 23, 24. Through this process, the processor 130 may obtain a plurality of normal distribution profiles based on the plurality of differential profiles 21, 22, 23, 24.

In addition, the processor 130 may be configured to obtain the FWHM for the target peak corresponding to each of the plurality of obtained normal distribution profiles as the feature value.

Here, the FWHM may be defined as a difference between values of two independent variables that are half of the maximum value of a function. That is, it is assumed that the function F(X) has a maximum value F(Xmax) at Xmax and that the values of the function F(X) at X1 and X2 decrease to half of the maximum value F(Xmax). That is, F(X1) and F(X2) may be equally expressed as "F(Xmax)±2". In this case, the FWHM is an absolute value of the difference between X1 and X2.

In general, the method of calculating the difference between the plurality of FWHMs in order to calculate the difference between the plurality of peaks is recognized as a more stable method than the method of directly comparing the magnitudes of the plurality of peak values.

For example, in the embodiment of FIG. 4, the differential voltages of the first target peak Tp1, the second target peak Tp2, the third target peak Tp3, and the fourth target peak Tp4 appear to gradually increase. Similarly, in the embodiment of FIG. 5, the feature value of the first target peak Tp1, the feature value of the second target peak Tp2, the feature value of the third target peak Tp3, and the feature value of the fourth target peak Tp4 also appear to gradually increase.

However, in the embodiment of FIG. 4, the differential voltages of the first to fourth target peak Tp1 to Tp4 appear to increase linearly, and thus it may be determined that the differential difference between the third target peak Tp3 and the fourth target peak Tp4 is not significantly different from differential differences between the remaining target peaks. Meanwhile, in the embodiment of FIG. 5, the third magnitude difference value D3 appears to show a clear difference from the first magnitude difference value D1 and the second magnitude difference value D2.

That is, in order to more precisely compare the plurality of target peaks, the processor 130 may normalize the plurality of differential profiles 21, 22, 23, 24 and calculate the FWHM of each of the plurality of target peaks as the feature value of each of the plurality of target peaks. Therefore, the DOC setting apparatus 100 according to an embodiment of the present disclosure has an advantage of setting an optimal DOC for preventing the inverse voltage of the battery B.

In addition, the DOC setting apparatus 100 according to the present disclosure may be provided to the battery manufacturing device 1. That is, the battery manufacturing device 1 according to the present disclosure may include the above-described DOC setting apparatus 100 and at least one battery B. In addition, the battery manufacturing device 1 may further include electronic components (relays, fuses, etc.) and a case.

For example, in the embodiment of FIG. 2, the DOC setting apparatus 100 may be provided to the battery manufacturing device 1 and electrically connected to the battery B.

Preferably, the battery manufacturing device 1 may be configured during an activation process of the battery B. That is, the DOC setting apparatus 100 according to an embodiment of the present disclosure may be electrically connected to the battery B during the activation process of the battery B to configure the battery manufacturing device 1. In addition, during the activation process, the DOC setting apparatus 100 may set an optimal DOC of the battery B.

Figure 6:
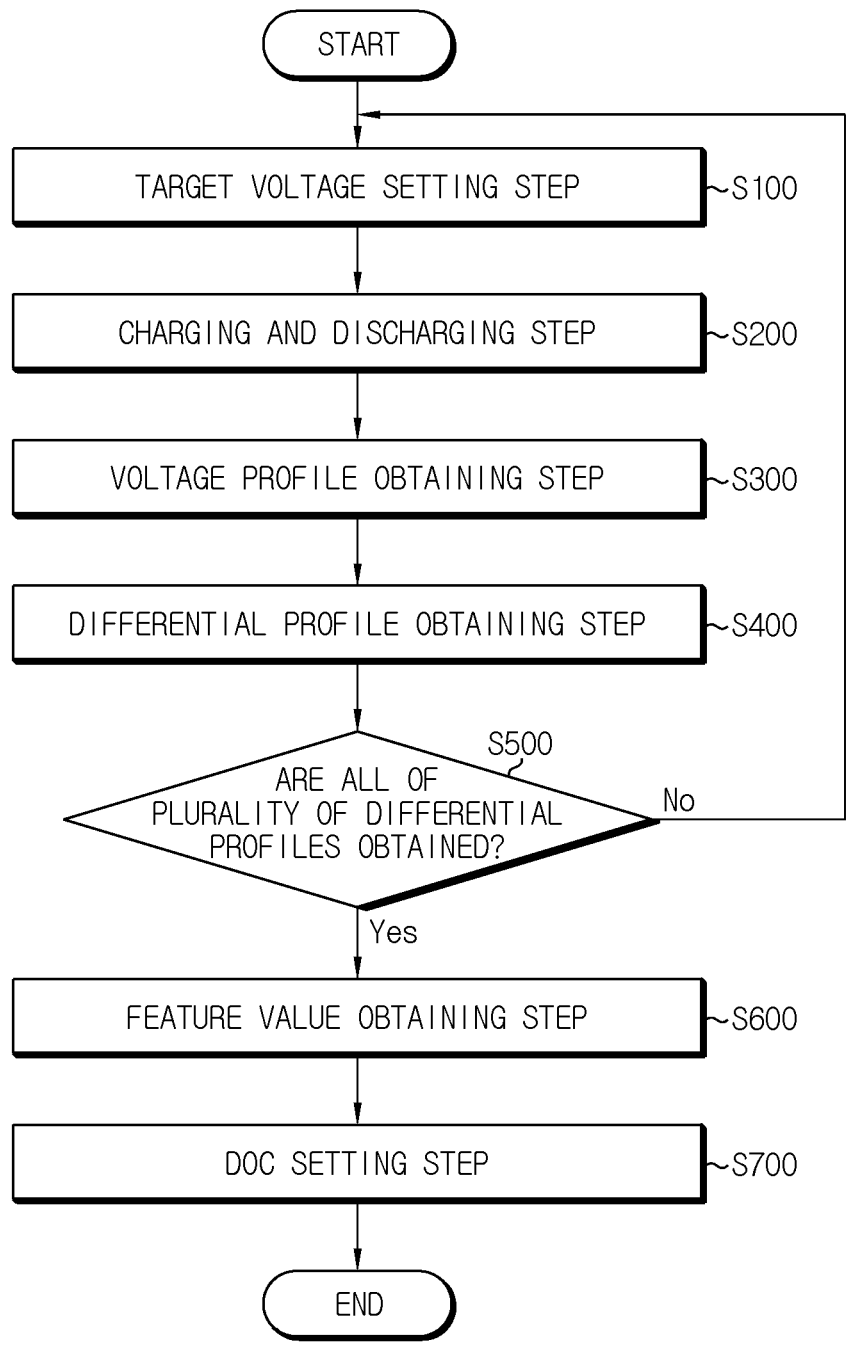
FIG. 6 is a diagram schematically showing a DOC setting method according to another embodiment of the present disclosure.

FIG. 6 is a diagram schematically showing a DOC setting method according to another embodiment of the present disclosure.

Each step of the DOC setting method may be performed by the DOC setting apparatus 100 according to an embodiment of the present disclosure. Hereinafter, content overlapping with the previously described content will be briefly described.

Referring to FIG. 6, the DOC setting method may include a target voltage setting step (S100), a charging and discharging step (S200), a voltage profile obtaining step (S300), a differential profile obtaining step (S400), a differential profile repeatedly obtaining step (S500), a feature value obtaining step (S600), and a DOC setting step (S700).

The target voltage setting step (S100) is a step of sequentially selecting any one of a plurality of preset voltages and setting the selected preset voltage as a target voltage, and may be performed by the processor 130.

For example, the plurality of voltage may be preset as 4.0 [V], 4.1 [V], 4.2 [V], and 4.3 [V]. The processor 130 may firstly set 4.0 [V] as a first target voltage.

The charging and discharging step (S200) is a step of charging the battery B to the target voltage (e.g., to completely charge the battery) and discharging the completely-charged battery B, and may be performed by the charging and discharging unit 110.

For example, the charging and discharging unit 110 may charge the battery B to the first target voltage (4.0 [V]) set by the processor 130. In addition, the charging and discharging unit 110 may discharge the battery B at a low rate of 0.05 C until the voltage of the battery B reaches 2.0 [V].

The voltage profile obtaining step (S300) is a step of obtaining a voltage profile for capacity and voltage of the battery B while the battery B is charged and discharged, and may be performed by the profile obtaining unit 120.

The profile obtaining unit 120 may measure the voltage and current of the battery B while the battery B is being discharged. In addition, the profile obtaining unit 120 may obtain a voltage profile for the capacity of the battery B and the voltage of the battery B.

The differential profile obtaining step (S400) is a step of obtaining a differential profile 20 for capacity and differential voltage of the battery B from the obtained voltage profile, and may be performed by the profile obtaining unit 120.

The profile obtaining unit 120 may differentiate the voltage of the battery B by the capacity of the battery B in the voltage profile obtained in the voltage profile obtaining step (S300). That is, the profile obtaining unit 120 may obtain the differential profile 20 for the capacity of the battery B and the differential voltage of the battery B (a value obtained by differentiating the voltage of the battery B by the capacity of the battery B).

The differential profile repeatedly obtaining step (S500) is a step of obtaining all of the plurality of differential profiles 21, 22, 23, 24 corresponding to the plurality of voltages, may be performed by the processor 130, the charging and discharging unit 110, and the profile obtaining unit 120.

That is, the differential profile repeatedly obtaining step (S500) may be a step of repeatedly performing the target voltage setting step (S100), the charging and discharging step (S200), the voltage profile obtaining step (S300) and the differential profile obtaining step (S400), until all of the differential profiles 20 are obtained for the plurality of preset voltages.

Specifically, when the plurality of differential profiles 21, 22, 23, 24 corresponding to the plurality of voltage are all obtained in the differential profile repeatedly obtaining step (S500), the feature value obtaining step (S600) may be performed. Alternatively, when any one of the plurality of differential profiles 21, 22, 23, 24 corresponding to the plurality of voltages is not obtained, the target voltage setting step (S100) may be performed.

For example, when the profile obtaining unit 120 obtains only the first differential profile 21 for the first target voltage, the processor 130 may set 4.1 [V] as the second target voltage. In addition, the charging and discharging unit 110 may charge the battery B until the voltage of the battery B reaches the second target voltage. After that, the charging and discharging unit 110 may discharge the battery B at a low rate of 0.05 C until the voltage of the battery B reaches 2.0 [V]. The profile obtaining unit 120 may obtain a second differential profile 22 corresponding to the second target voltage while the battery B is discharged. According to a similar method, the profile obtaining unit 120 may obtain a third differential profile 23 corresponding to the third target voltage (4.2 [V]) and a fourth differential profile 24 corresponding to the fourth target voltage (4.3 [V]).

The feature value obtaining step (S600) is a step of obtaining a feature value for a target peak in each of the plurality of differential profiles 21, 22, 23, 24, and may be performed by the processor 130.

The processor 130 may select a target peak in each of a plurality of differential profiles 21, 22, 23, 24. Specifically, the target peak may be a peak associated with the behavior of $LiC_{12}$ according to DOC.

In addition, the processor 130 may calculate a FWHM as the feature value of each of the plurality of target peaks. To this end, the processor 130 may obtain a plurality of normal distribution profiles by normalizing each of the plurality of differential profiles 21, 22, 23, 24, and may respectively calculate the FWHM of the target peak in each of the plurality of obtained normal distribution profiles.

The DOC setting step (S700) is a step of setting a DOC for the battery B based on the plurality of obtained feature values, and may be performed by the processor 130.

For example, in the embodiment of FIG. 5, the processor 130 may calculate a first magnitude difference value D1 between the feature value of the first target peak Tp1 and the feature value of the second target peak Tp2. In addition, the processor 130 may calculate a second magnitude difference value D2 between the feature value of the second target peak Tp2 and the feature value of the third target peak Tp3. In addition, the processor 130 may calculate a third magnitude difference value D3 between the feature value of the third target peak Tp3 and the feature value of the fourth target peak Tp4. In addition, the processor 130 may select the feature value of the third target peak Tp3 and the feature value of the fourth target peak Tp4 as reference feature values, based on the first magnitude difference value D1, the second magnitude difference value D2 and the third magnitude difference value D3. In addition, the processor 130 may select one of the third target voltage corresponding to the third target peak Tp3 and the fourth target voltage corresponding to the fourth target peak Tp4 as the reference voltage.

The embodiments of the present disclosure described above are not necessarily implemented by an apparatus and method but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery manufacturing device
20: differential profile
21: first differential profile 22: second differential profile
23: third differential profile
24: fourth differential profile
100: DOC setting apparatus
110: charging and discharging unit
120: profile obtaining unit
130: processor
140: storage unit
B: battery

What is claimed is:

1. A depth of charge (DOC) setting apparatus, comprising:
a charging and discharging unit configured to charge a battery to a set target voltage and discharge the charged battery;
a profile obtaining unit configured to obtain a voltage profile for capacity and voltage of the battery while the battery is charged and discharged and obtain a differential profile for capacity and differential voltage of the battery from the obtained voltage profile; and
a processor electrically connected to the charging and discharging unit and configured to sequentially select any one of a plurality of preset voltages and set the selected preset voltage as the target voltage, wherein when the profile obtaining unit obtains all of a plurality of differential profiles corresponding to the plurality of preset voltages, the processor is configured to obtain a feature value for a target peak in each of the plurality of differential profiles and set a DOC for the battery based on the plurality of obtained feature values.

2. The DOC setting apparatus according to claim 1, wherein the processor is configured to compare magnitudes of the plurality of obtained feature values, select any one of a plurality of target voltages respectively corresponding to the plurality of obtained feature values as a reference voltage according to the comparison result, and set the selected reference voltage as the DOC.

3. The DOC setting apparatus according to claim 2, wherein the processor is configured to calculate a magnitude difference value between a plurality of feature values whose corresponding target voltages are close to each other among the plurality of obtained feature values, select a plurality of reference feature values for which the calculated magnitude difference value is greatest, and select any one of the plurality of target voltages as the reference voltage according to the magnitude difference value of the plurality of selected reference feature values.

4. The DOC setting apparatus according to claim 3, wherein the processor is configured to calculate the magnitude difference value by comparing magnitudes of two feature values close to each other based on the corresponding target voltages thereof.

5. The DOC setting apparatus according to claim 3, wherein the processor is configured to select a target voltage at a lowest potential side among the plurality of target voltages corresponding to the plurality of selected reference feature values as the reference voltage.

6. The DOC setting apparatus according to claim 5, wherein the processor is configured to select the target voltage at the low potential side as the reference voltage, when the magnitude difference value between the plurality of selected reference feature values is greater than or equal to a predetermined magnitude value.

7. The DOC setting apparatus according to claim 6, wherein the predetermined magnitude value is set to a value twice as large as a second largest magnitude difference value among a plurality of magnitude difference values.

8. The DOC setting apparatus according to claim 3, wherein the processor is configured to select a target voltage at a highest high potential side among the plurality of target voltages as the reference voltage, when the magnitude difference value between the plurality of selected reference feature values is smaller than a predetermined magnitude value.

9. The DOC setting apparatus according to claim 1, wherein the profile obtaining unit is configured to obtain a differential profile for the differential voltage, which is obtained by differentiating the voltage of the battery by the capacity, and the capacity of the battery.

10. The DOC setting apparatus according to claim 9, wherein the processor is configured to determine a plurality of peak pairs in each of the plurality of differential profiles, select a peak pair where differential voltages of a plurality of peaks included in the determined peak pairs are most different among the determined peak pairs, and select a peak at a low capacity side among the plurality of peaks included in the selected peak pair as the target peak.

11. The DOC setting apparatus according to claim 10, wherein the processor is configured to determine two peaks located at a top and a bottom in a region where the differential voltage increases as the capacity of the battery increases among the plurality of peaks as one peak pair.

12. The DOC setting apparatus according to claim 10, wherein the battery includes lithium and graphite as a negative electrode active material, and
wherein the target peak is a peak associated with behavior of $LiC_{12}$ according to the DOC.

13. The DOC setting apparatus according to claim 10, wherein the processor is configured to obtain a plurality of normal distribution profiles by normalizing each of the plurality of differential profiles and obtain a full width at half maximum (FWHM) for a target peak corresponding to each of the plurality of obtained normal distribution profiles as the feature value.

14. A battery manufacturing device, comprising the DOC setting apparatus according to claim 1.

15. The DOC setting apparatus according to claim 1, further comprising a storage configured to store the plurality of differential profiles and the set DOC for the battery based on the plurality of obtained feature values.

16. A depth of charge (DOC) setting method, comprising:
sequentially selecting any one of a plurality of preset voltages and setting the selected preset voltage as a target voltage;
charging a battery to the target voltage and discharging the charged battery;
obtaining a voltage profile for capacity and voltage of the battery while the battery is charged and discharged;
obtaining a differential profile for capacity and differential voltage of the battery from the obtained voltage profile;
obtaining all of a plurality of differential profiles corresponding to the plurality of preset voltages;
obtaining a feature value for a target peak in each of the plurality of differential profiles; and
setting a DOC for the battery based on the plurality of obtained feature values.

17. The method according to claim 16, wherein the feature value includes at least one of a capacity value, a differential voltage value, or a full width at half maximum (FWHM) of the target peak.

18. The method according to claim 16, wherein a first voltage of the plurality of preset voltages is set to a lowest voltage, and each remaining preset voltage of the plurality of preset voltages increases by a constant amount from a next lowest voltage starting with the first voltage.

19. The method according to claim 16, wherein the differential profile includes a plurality of peaks, and
   wherein a peak is a point corresponding to an inflection point in the obtained voltage profile.

20. The method according to claim 16, wherein the setting the DOC for the battery is set based on two reference feature values having a greatest magnitude difference values between feature values of a plurality of target peaks.

\* \* \* \* \*